(12) United States Patent
DeYoung et al.

(10) Patent No.: US 10,622,511 B2
(45) Date of Patent: Apr. 14, 2020

(54) ILLUMINATED OPTICAL DEVICE

(71) Applicant: Innotec, Corp., Zeeland, MI (US)

(72) Inventors: Jonathan R. DeYoung, Grand Rapids, MI (US); Hendrick Harms, Wayland, MI (US)

(73) Assignee: Innotec, Corp., Zeeland, MI (US)

( * ) Notice: Subject to any disclaimer, the term of this patent is extended or adjusted under 35 U.S.C. 154(b) by 0 days.

(21) Appl. No.: 16/179,190

(22) Filed: Nov. 2, 2018

(65) Prior Publication Data

US 2019/0140138 A1    May 9, 2019

Related U.S. Application Data

(60) Provisional application No. 62/581,369, filed on Nov. 3, 2017.

(51) Int. Cl.

| | |
|---|---|
| *H01L 33/08* | (2010.01) |
| *G02B 27/09* | (2006.01) |
| *H01L 33/52* | (2010.01) |
| *H01L 33/58* | (2010.01) |
| *H01L 33/26* | (2010.01) |
| *F21K 9/00* | (2016.01) |
| *F21K 9/23* | (2016.01) |

(52) U.S. Cl.
CPC ............ *H01L 33/08* (2013.01); *F21K 9/00* (2013.01); *F21K 9/23* (2016.08); *G02B 27/0955* (2013.01); *H01L 33/26* (2013.01); *H01L 33/52* (2013.01); *H01L 33/58* (2013.01)

(58) Field of Classification Search
CPC ......... H01L 33/08; H01L 33/26; H01L 33/52; H01L 33/58; G02B 27/0955

USPC .......................................................... 257/98
See application file for complete search history.

(56) References Cited

U.S. PATENT DOCUMENTS

| | | | |
|---|---|---|---|
| 7,712,933 B2 | 5/2010 | Fleischmann et al. | |
| 7,815,339 B2 | 10/2010 | Veenstra et al. | |
| 7,837,359 B2 | 11/2010 | Danek et al. | |
| 7,909,482 B2 | 3/2011 | Veenstra et al. | |
| 8,230,575 B2 | 7/2012 | Veenstra et al. | |
| 8,408,773 B2 | 4/2013 | Judge | |
| 8,764,240 B2 | 7/2014 | Veenstra et al. | |
| 2005/0269587 A1* | 12/2005 | Loh | H01L 33/486 257/99 |
| 2009/0154182 A1* | 6/2009 | Veenstra | B60Q 1/2696 362/487 |
| 2018/0323354 A1* | 11/2018 | Wang | H01L 33/54 |

FOREIGN PATENT DOCUMENTS

| | | |
|---|---|---|
| WO | 2007064701 A1 | 6/2007 |
| WO | 2009076579 A2 | 6/2009 |
| WO | 2017213829 A1 | 12/2017 |

OTHER PUBLICATIONS

The International Search Report and the Written Opinion of the International Searching Authority, dated Feb. 21, 2019 (Application No. PCT/US 2018/058959) 9 pages.

* cited by examiner

*Primary Examiner* — Tu-Tu V Ho
(74) *Attorney, Agent, or Firm* — Price Heneveld, LLP (57) ABSTRACT

A method of fabricating an illuminated optical device includes forming an electrically conductive circuit. A lens at least partially encapsulates the LED. Additional material may be formed around the lens without obstructing a light-transmitting surface of the lens.

20 Claims, 8 Drawing Sheets

ILLUMINATED OPTICAL DEVICE

CROSS-REFERENCE TO RELATED APPLICATION

This application claims the benefit under 35 U.S.C. § 119(e) of U.S. Provisional Patent Application No. 62/581,369, filed Nov. 3, 2017, entitled "90 DEGREE FORMED OPTIC WITH STRAIGHT PULL ENCAPSULATION," which is incorporated herein by reference in its entirety.

BACKGROUND

Various types of illuminated devices have been developed. For example, farm equipment, construction equipment, earth moving equipment, and the like may include beacon warning lights that alert others to the presence of the equipment. Beacon lights may be mounted to an upper portion of the equipment so it is visible at a distance. Beacon lights may comprise a rotating light that is disposed inside an amber or other light-transmitting housing. However, known beacon lights may suffer from various drawbacks.

SUMMARY OF THE INVENTION

One aspect of the present disclosure is a method of fabricating an illuminated optical device. The method includes forming an electrically conductive circuit having first and second opposite side surfaces and first and second regions. Electronic components may be secured to the first and/or second regions. At least one LED may be secured to the second region. The method further includes forming a lens having an exterior light-emitting surface. The lens may be formed by at least partially encapsulating the LED with a light-transmitting first polymer material. The light-transmitting first polymer material may form a perimeter surface around the exterior light-emitting surface of the lens. The perimeter surface may face outwardly away from the exterior light-emitting surface of the lens. The method may include forming an intermediate assembly by bending the electrically conductive circuit between the first and second regions such that the first side surfaces of the first and second regions are transverse relative to one another. For example, the first and second regions may be disposed at about 90° relative to one another after bending. However, the present disclosure is not limited to 90°, and other angles may be utilized as required for a specific application. The method further includes positioning the intermediate assembly in a mold tool. The mold tool may include first and second tool components that move relative to each other between open and closed positions. The first and second tool components define a mold cavity around at least a portion of the intermediate assembly when the tool components are in the closed position. The first and second tool components may include first and second sealing surfaces, respectively, that engage the perimeter surface around the exterior light-emitting surface of the lens and close off the cavity whereby the exterior light-emitting surface of the lens is outside of the cavity. The method may further include at least partially filling the mold cavity with a second polymer material, and curing the second polymer material. The light-transmitting first polymer material may optionally comprise a transparent or substantially transparent thermoplastic polymer material, and the second polymer material may optionally comprise an opaque thermoplastic polymer material. One or both of the first and second polymer materials may optionally comprise thermosetting polymer. The conductive circuit is optionally formed from sheet metal. The conductive circuit may, optionally, be flat prior to bending, and the first and second portions may, optionally, be orthogonal to one another after bending. The light-transmitting first polymer may optionally include at least one convex region forming a lens that distributes light emitted from the LED in a predefined pattern. The conductive circuit may optionally be formed from sheet metal. The sheet metal may optionally have a uniform thickness. The conductive circuit may optionally be flat prior to bending. The first and second portions may optionally be orthogonal to one another after bending. The light-transmitting first polymer material may optionally comprise a material selected from the group consisting of thermoplastic polymers and thermosetting polymers. The second polymer may optionally comprise an opaque polymer material selected from the group consisting of thermoplastic polymers and thermosetting polymers. The light-transmitting first polymer material may optionally include at least one convex region forming a lens that distributes light emitted from the LED in a predefined pattern. The light-transmitting first polymer material may optionally include a wall extending around the at least one convex region. The wall may optionally form the perimeter surface. The light-transmitting first polymer may optionally form a groove extending around the at least one convex region. The light-transmitting first polymer may optionally include a base portion that is molded to the electrically conductive circuit. The at least one convex region and the wall are optionally integrally formed with the base portion. The at least one convex region and the wall may optionally extend outwardly from the base portion. The wall may optionally include horizontally-extending upper and lower sections that define upwardly and downwardly facing perimeter surface portions, respectively. The wall may also optionally include end portions extending between and interconnecting the horizontally-extending upper and lower sections. Each end section is optionally non-linear, and optionally defines upper perimeter portions facing outwardly and upwardly, and lower perimeter portions facing outwardly and downwardly.

Another aspect of the present disclosure is a method of fabricating an illuminated optical device. The method may include forming an electrically conductive circuit, and securing at least one LED to the electrically conductive surface. The method may further include at least partially encapsulating the LED light-transmitting first polymer material. The light-transmitting first polymer material may optionally form a lens having a light-emitting surface. The light-emitting surface may optionally face away from the electrically conductive surface. The method may include forming a perimeter surface around the exterior light-emitting surface of the lens. The method may further include pending the electrically conductive circuit to form first and second regions having side surfaces that are transverse relative to one another. A method may further include molding a second polymer material over at least a portion of the first polymer material without molding over the exterior light-emitting surface of the first polymer material with the second polymer material. The method may optionally include forming a perimeter surface that faces outwardly away from the exterior light-emitting surface of the lens. A method may also optionally include bending the electrically conductive circuit to form an intermediate assembly. The intermediate assembly may optionally position in a mold tool, and a mold tool may optionally include first and second tool components that move relative to each other between open and closed positions. The first and second tool components may optionally define a mold cavity around at least a portion of the intermediate assembly when in the closed position. The first and second sealing surfaces, respectively, may optionally engage the perimeter surface around the exterior light-emitting surface of the lens, and may optionally close off the cavity, whereby the exterior light-emitting surface of the lens is outside of the cavity. The conductive circuit is optionally generally flat prior to bending, and the first and second portions are optionally generally orthogonal to one another after bending. The light-transmitting first polymer optionally includes at least one convex region forming a lens. The lens optionally distributes light emitted from the LED in a predefined pattern.

Another aspect of the present invention is an illuminated optical device including an electrically conductive circuit. The electrically conductive circuit may include horizontal and vertical portions. The device may optionally include at least one LED light source disposed on the vertical portion. The device may include a lens comprising light-transmitting first polymer material at least partially encapsulating the LED light source and optionally defining a light-transmitting exterior surface. The device may optionally include a body comprising a second polymer material. The second polymer material may optionally encapsulate at least a portion of the electrically conductive circuit. The second polymer material may optionally extend around the light-transmitting exterior surface of the lens without covering the light-transmitting exterior surface. The body may optionally include a central portion defining a vertical axis. The electrically conductive circuit optionally includes a plurality of vertical portions. The vertical portions are optionally disposed about the vertical axis, and optionally face away from the vertical axis at non-equal angular orientations. The device optionally includes LED light sources disposed on at least two of the vertical portions. Lenses comprising light-transmitting first polymer material optionally encapsulate the LED light sources whereby the lenses are configured to distribute light outwardly away from the vertical axis. The first and second polymer materials optionally comprise thermoplastic polymers or thermosetting polymers. The light-transmitting exterior surface optionally includes at least one convex portion, and a channel extending around at least one convex portion.

An illuminated device according to the present disclosure may comprise an optic in which a circuit, a lens, and an LED are formed vertically or approximately vertically, which in turn is nearly perpendicular to a main body of the illuminated device. An electrical connection between the two planes may be made by connecting a formed metallic conducting trace from the electrical components on one plane to the electrical components on the other plane. The illuminated device may include an optic comprising polymer that is molded over the LED. The optic may comprise a secondary piece that is assembled into the construction. The optic may comprise a cast resin or compound.

The circuit, optic, and LED subassembly are at least partially covered in an encapsulating material. The encapsulating material may optionally comprise an over-molded thermoplastic polymer, or the encapsulating material may optionally comprise a cast resin or compound. A feature or "shelf" detail integral to the optic is used for tool shutoff in the Z axis (i.e. the "straight-pull" direction) to permit encapsulation when molding thermoplastic material or when casting thermosetting material.

The disclosure may provide for orienting the LED in a direction according to the light requirements to increase the efficiency of the light on a target. Encapsulating material may be provided to protect and seal the LED and the circuitry. Tooling may be simplified, and may optionally accomplish encapsulation without use of slides and/or action in the tool. The LEDs may be positioned for optimum light on target efficiency, and the process may provide a sealed, durable construction.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 1;

DETAILED DESCRIPTION

Figure 1:
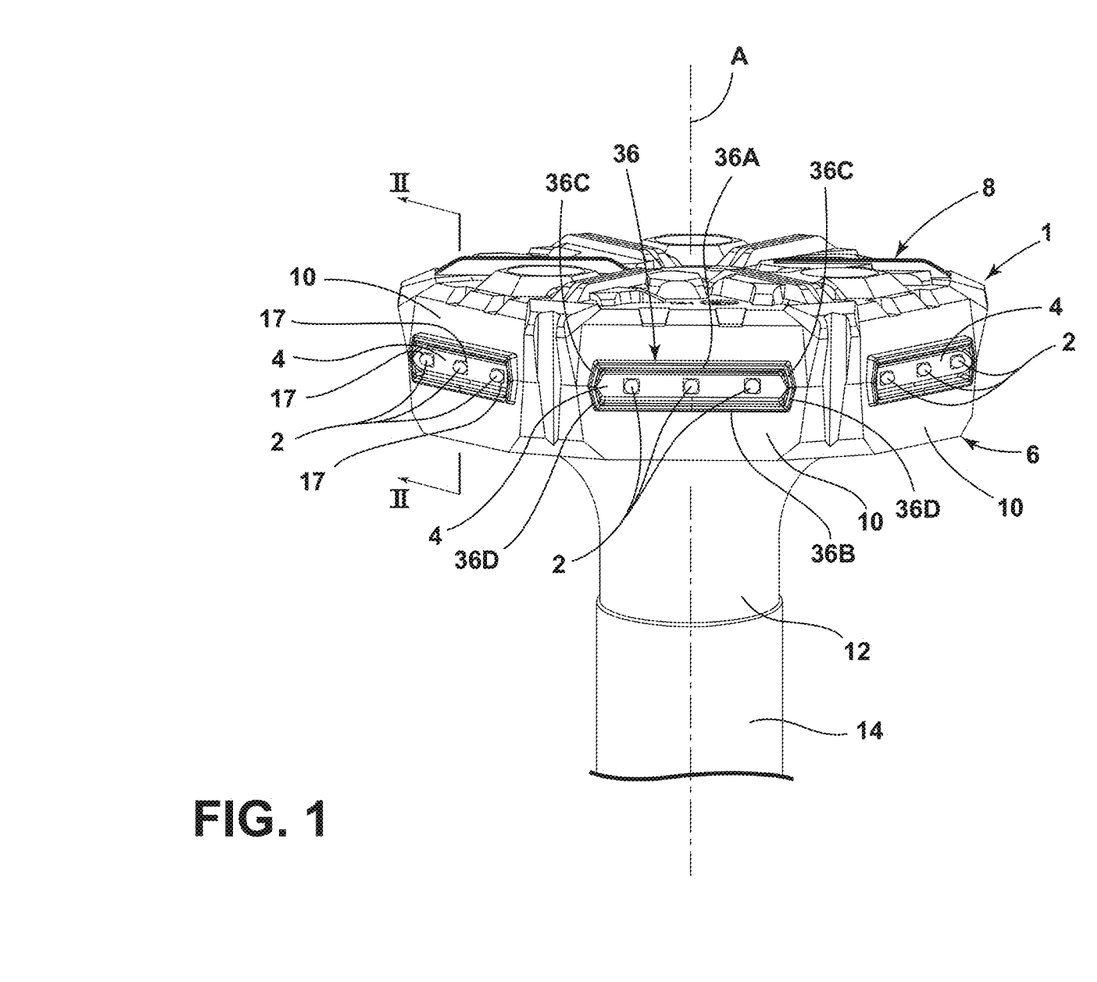
FIG. 1 is a partially fragmentary isometric view of a device according to one aspect of the present disclosure.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

With reference to FIG. 1, an illuminated device 1 includes a plurality of LEDs 2 that are encapsulated in light-transmitting material of lenses 4. As discussed in more detail below, the lenses 4 may be molded over the LEDs 2 utilizing a first thermosetting or thermoplastic polymer material. A polymer body 6 may comprise thermosetting or thermoplastic second polymer material that is molded around the lenses 4 in a second molding shot. The polymer body 6 may optionally comprise opaque (e.g. black) thermoplastic polymer material. The illuminated device 1 may comprise a beacon light having an upper portion 8 with, for example, six side faces 10 facing outwardly away from a central axis "A" of the illuminated device 1. Polymer body 6 may include a base 12 that is integrally formed from the same second polymer as upper portion 8. The base 12 may be configured for mounting to an upright tube 14 or the like to thereby support the illuminated device 1 on an upper portion of farm equipment, construction equipment or the like. Device 1 may be configured to be coupled to a rotating member (not shown) whereby the device 1 rotates about a vertical axis to function as a beacon light. However, it will be understood that device 1 is not limited to beacon lights. It will be understood that the first and second polymer materials may be identical.

Figure 2:
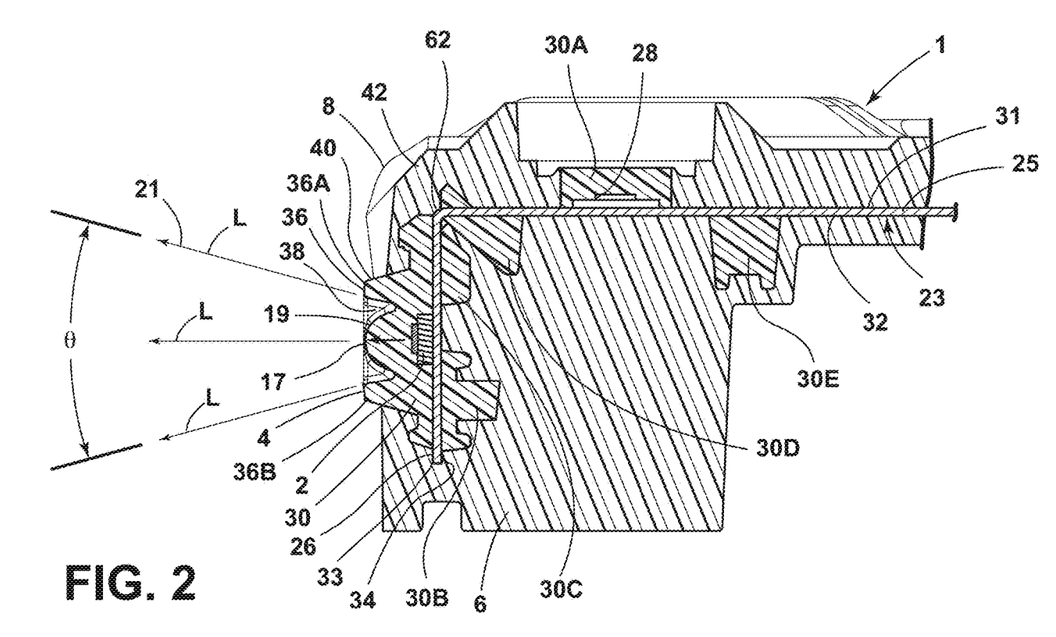
FIG. 2 is a cross-sectional view taken along the line II-II.
Figure 2A:
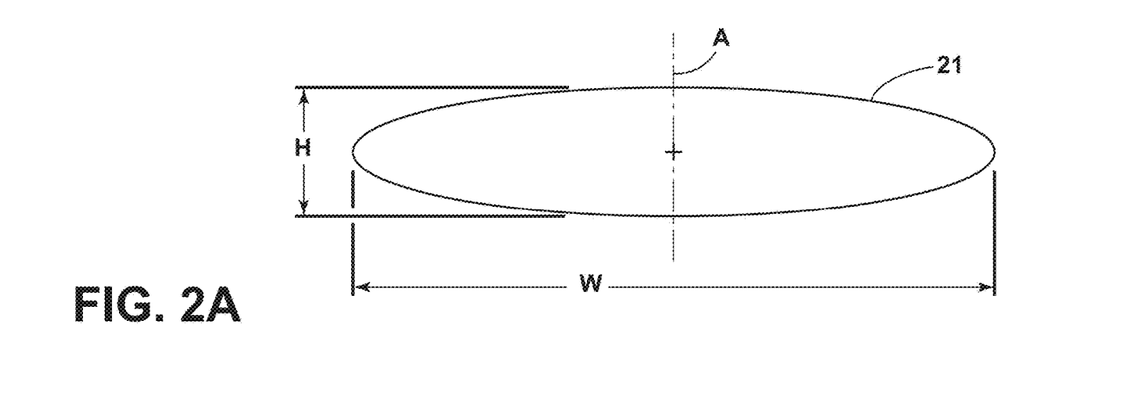
FIG. 2A is a schematic showing a light distribution.

The LEDs 2 and/or the polymer material of lenses 4 may be configured to provide a desired light color (e.g. amber). The lenses 4 may include convex portions 17 (see also FIG. 2) that are aligned with LEDs 2. The convex portions 17 include a light-emitting outer surface 19. When the LEDs 2 are illuminated, light "L" forms a predefined pattern 21. The convex portions 17 of lenses 4 may be configured to form a predefined pattern 21 (FIG. 2A) having a width "W" that is significantly greater than a height "H." Referring again to FIG. 1, each individual lens 4 may be configured to provide different predefined patterns 21, such that the light emitted from the device 1 has substantially equal intensity in all directions about the vertical axis A. Individual convex portions 17, may, optionally, have unique shapes to distribute light as required to provide a required overall light pattern from device 1. For example, if three LEDs 2 "share" a single lens 4, the center LED may have a light pattern 21 that is symmetrical as shown in FIG. 2A, and the outer LEDs 2 may have light patterns that are not symmetrical to thereby direct more light to the outer sides (away from the center LED 2). The angle θ (FIG. 2) and the corresponding height dimension "H" (FIG. 2A) may be relatively small. In this way, the light L from the LEDs 2 is distributed outwardly around the illuminated device 1 in a manner that is readily visible at a distance at a full 360° around the device 1. Because the light "L" is not directed upwardly or downwardly (i.e. parallel to vertical axis A) to a significant degree, the light from the LEDs 2 is utilized efficiently to alert others to the presence of the device 1.

Referring again to FIG. 2, device 1 includes a circuit 23 having a horizontal upper portion 25 and one or more vertical edge portions 26. Each side face 10 (FIG. 1) may correspond to a vertical edge portion 26, and each vertical edge portion 26 may have one or more LEDs 2 mounted thereto. Electronic circuit elements 28 may be secured to the horizontal upper portion 25 of circuit 23 and/or edge portions 26. The electronic circuit elements 28 may comprise circuit components that are configured to provide the required electrical power to the LEDs 2 from an electrical power source (e.g. 12 Volt DC) from an associated piece of equipment. Device 1 may optionally include prongs or connectors 50 in a central portion 48 of circuit 23 (FIG. 4) that may be formed (bent) to extend downwardly as shown in dashed lines 50A whereby the connectors 50 may be utilized to connect the circuit 23 to the electrical power supply of an associated piece of equipment.

As discussed in more detail below, lens 4 may be formed from polymer material 30 during a first molding shot or step. The first polymer material 30 may be utilized to form encapsulating material 30A (FIG. 2) to encapsulate one or more electronic circuit elements 28 on first side surface 31 of horizontal upper portion 25 of circuit 23. The first polymer material 30 may also form lens 4 on first side surface 33 of vertical edge portion 26 of circuit 23. The polymer material 30 may include portions 30B-30E that are molded onto second side surfaces 32 and 34 of horizontal upper portion and vertical edge portion 26 of circuit 23, respectively. The portions 30B-30E may provide for flow of the first polymer material 30 during the first molding shot, and may further provide support/location surfaces that may be utilized during the second mold shot/step.

Referring again to FIG. 2, the first polymer material 30 also forms a wall or flange 36 extending around the convex portion 17. A channel or groove 38 is formed by the wall and convex portion 17. Groove 38 may extend around the convex portion 17. Referring again to FIG. 1, the wall or flange 36 includes a horizontally extending upper portion 36A and a horizontally extending lower portion 36B. End portions 36C and 36D extend between the upper and lower portions 36A and 36B. As discussed in more detail below, the configuration of the wall or flange 36 provides a perimeter surface 40 that faces outwardly away from the exterior light-emitting surface 19 of convex portion 17 of lens 4. A mold tool 70 (FIG. 8) utilized for a second mold shot engages the perimeter surface 40 to retain second shot polymer material 42 such that the polymer material 42 does not extend over the exterior light-emitting surface 19 of lens 4.

Figure 3:
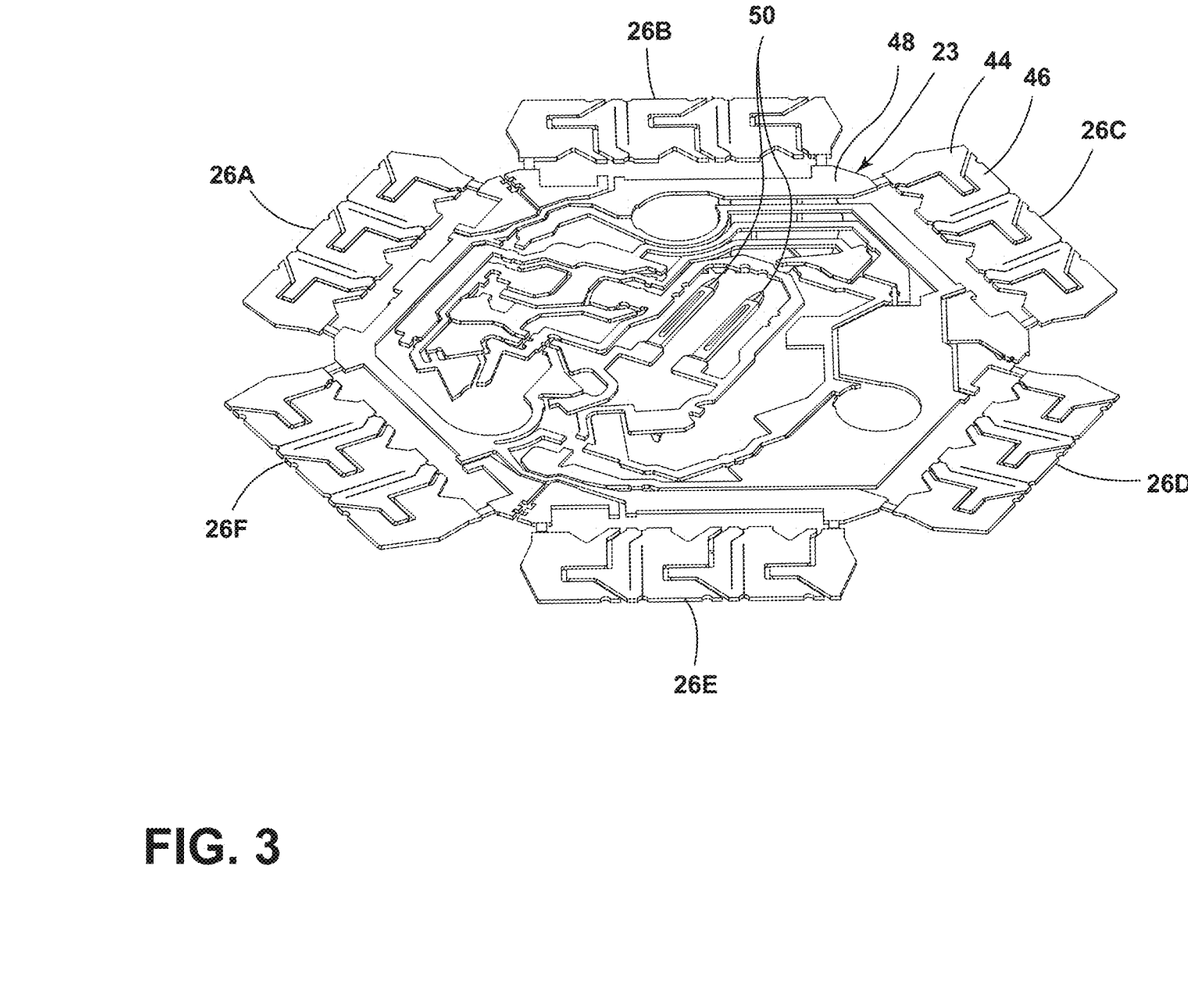
FIG. 3 is an isometric view of a circuit.

With reference to FIG. 3, circuit 23 may be formed from conductive material such as flat sheet metal (e.g. steel) or other suitable material utilizing dies or other suitable tooling. However, circuit 23 may be fabricated from virtually any conductive material utilizing any suitable process. The circuit 23 generally includes first and second conductive portions 44 and 46 that are electrically connected to the positive and negative poles of an electrical power supply by prongs 50 to thereby provide electrical power to the LEDs 2 and electronic circuit elements 28. The circuit 23 is initially formed in a substantially flat configuration as shown in FIG. 3, with a central portion 48 and six flaps or edge portions 26A-26F. It will be understood that the circuit 23 may include a single edge portion 26, or it may include two or more edge portions 26 as required for a particular application. The circuit 23 of FIG. 3 includes six edge portions 26A-26F corresponding to the six side faces 10 (FIG. 1) of device 1.

Figure 4:
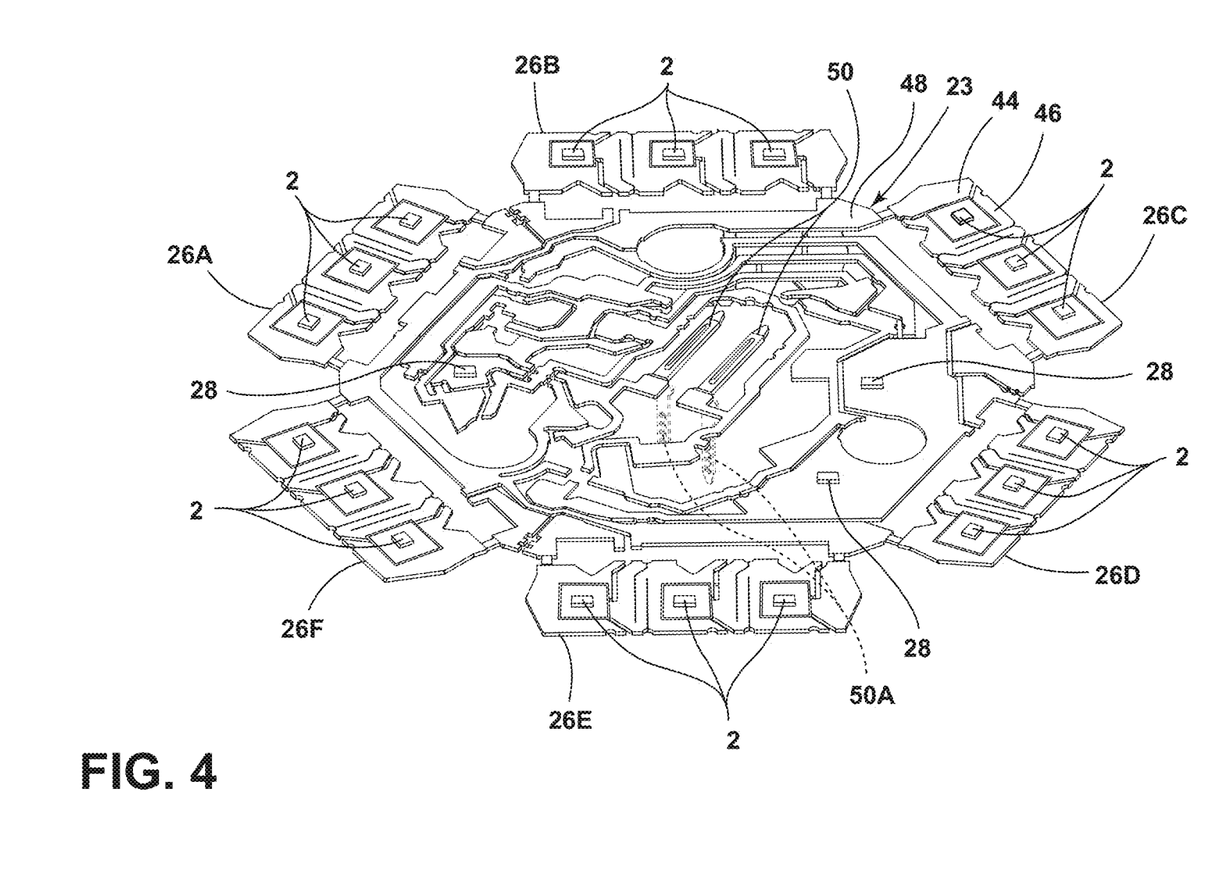
FIG. 4 is an isometric view of a circuit having LEDs and/or electronic components attached thereto.

With further reference to FIG. 4, LEDs 2 are attached to the edge portions 26A-26F by soldering or other suitable technique. Electronic circuit elements 28 may be secured to the central portion 48 and/or edge portions 26A-26F of circuit 23 by soldering or other suitable techniques. It will be understood that the present disclosure is not limited to a specific material (e.g. solder) or process.

Figure 5:
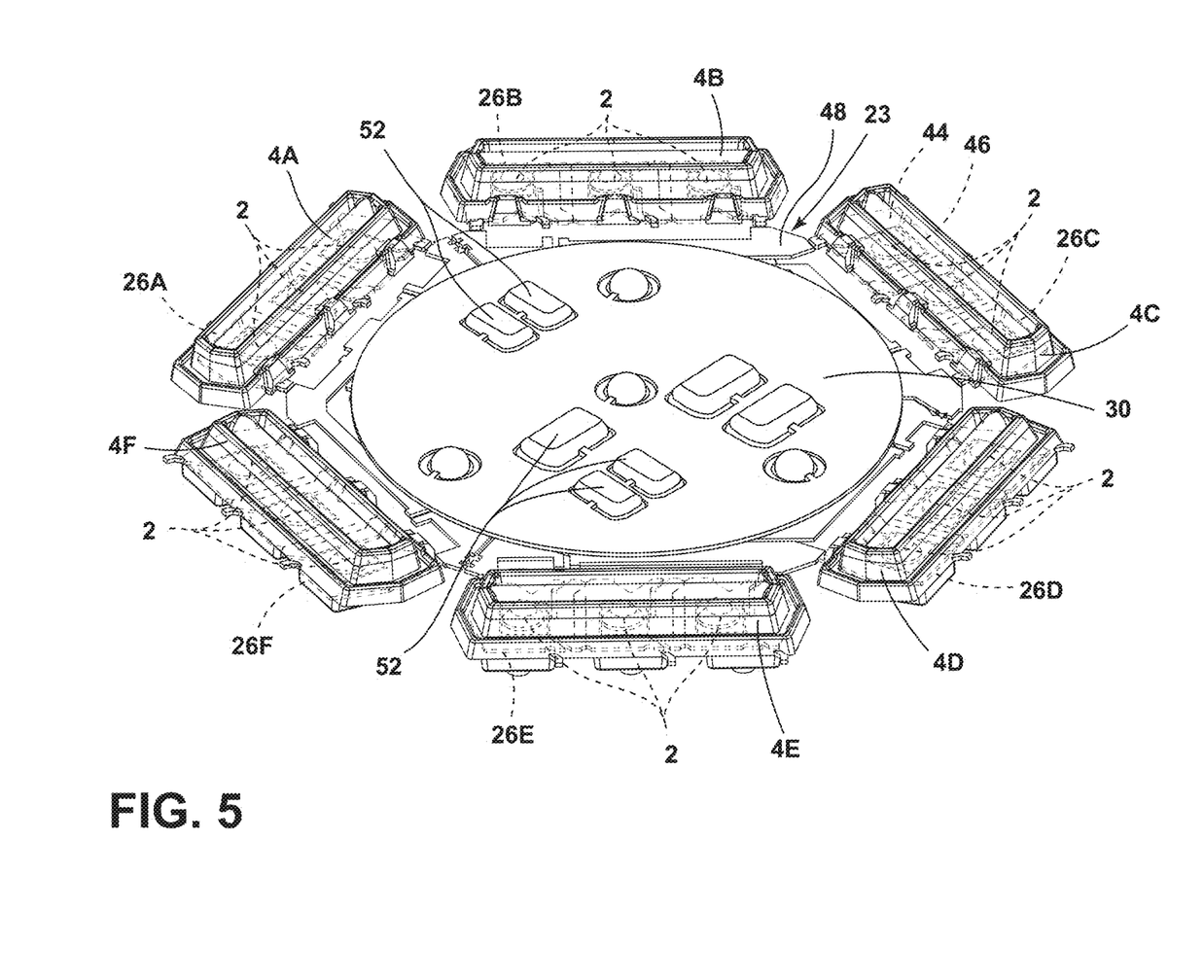
FIG. 5 is an isometric view of an intermediate assembly showing the LEDs and/or electronic components following a first molding step or shot.

With further reference to FIG. 5, first shot polymer material 30 is then molded over the LEDs 2 to form lenses 4A-4F on edge portions 26A-26F, respectively. The polymer material 30 of the first shot may be utilized to form encapsulating portions 52 over the electronic circuit elements 28. The polymer material 30 may also at least partially cover the central portion 48 of circuit 23. However, the present disclosure is not limited to any specific encapsulation configuration.

Figure 6:
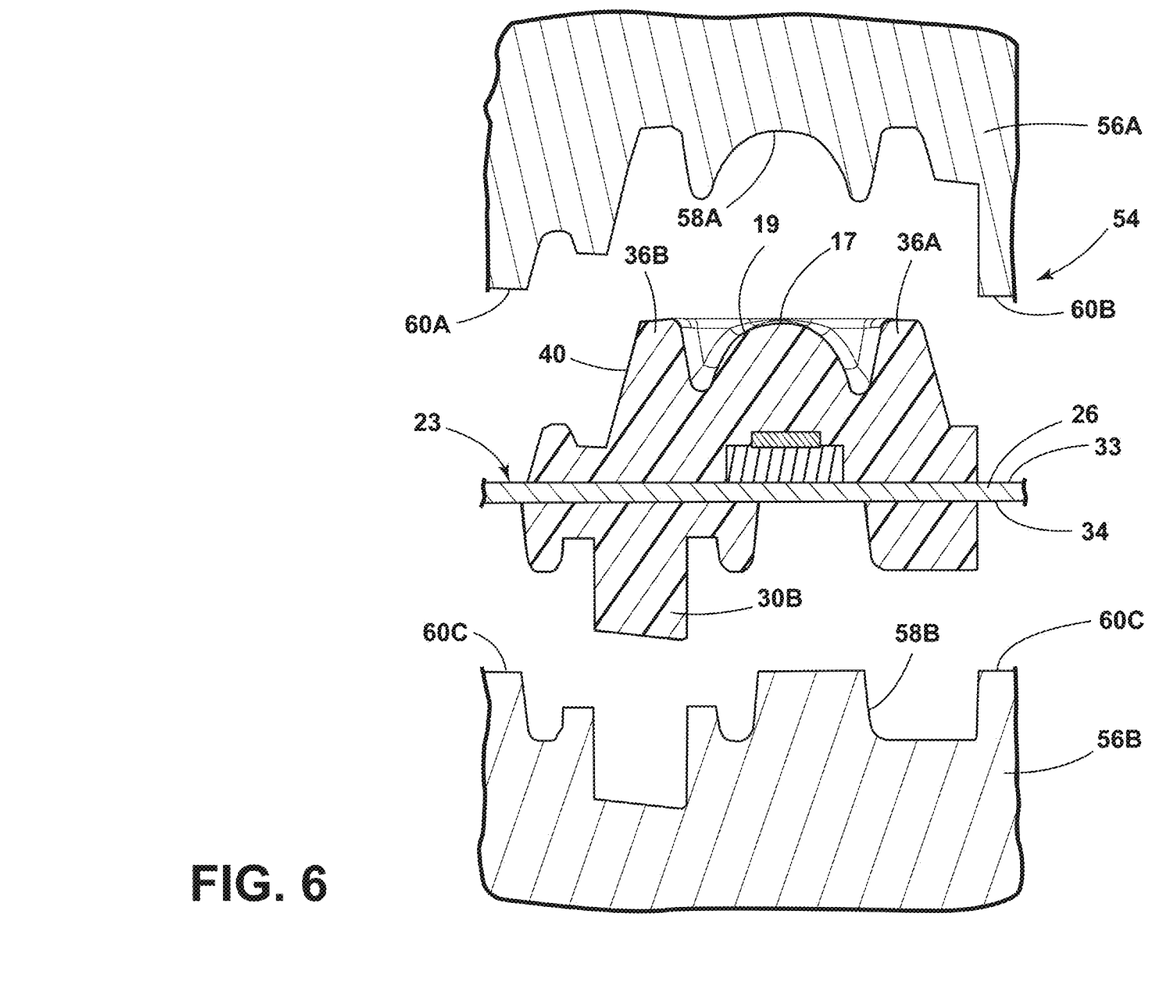
FIG. 6 is a partially fragmentary cross-sectional view showing a mold tool utilized to form a lens in a first molding shot.

With further reference to FIG. 6, a mold tool 54 utilized to perform the first molding shot may include first and second mold parts 56A and 56B, respectively, having mold cavity surfaces 58A and 58B, respectively that form a cavity when the mold parts 56A and 56B are in a closed position. Surfaces 60A-60C of the mold parts 56A and 56B may be configured to engage the first and second side surfaces 33 and 34 of circuit element 26 when the mold parts 56A and 56B are in a closed position to thereby cause the first shot molding material 30 to encapsulate the LEDs 2. It will be understood that the present disclosure is not limited to a specific mold tool configuration.

Figure 7:
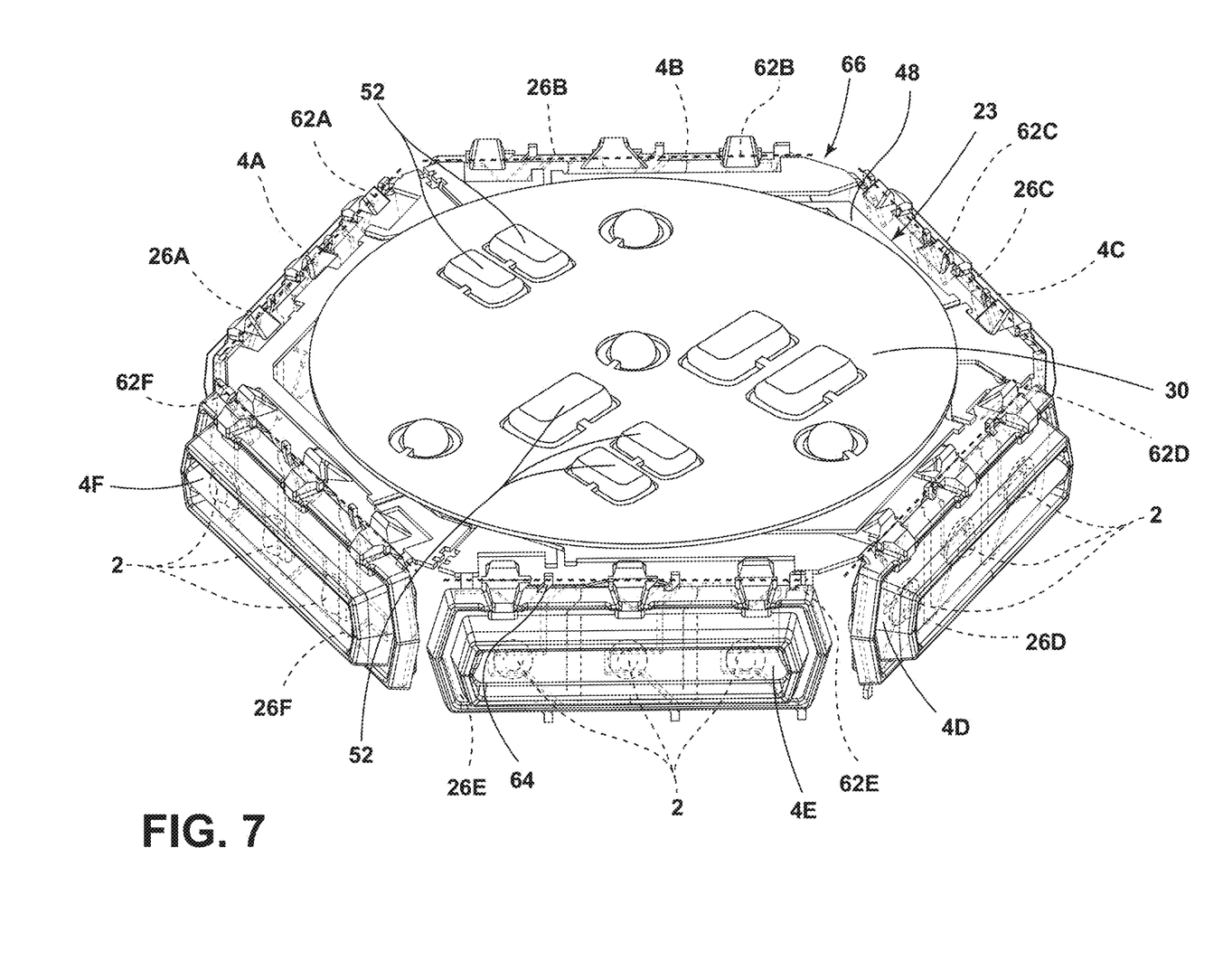
FIG. 7 is an isometric view of the intermediate assembly of FIG. 5 after edge portions of the circuit are deformed relative to a central portion of the intermediate assembly.

With further reference to FIG. 7 after the first molding shot, the edge portions 26A-26F are bent downwardly to a position that is transverse relative to the central portion 48 of the circuit 23 to form an intermediate assembly 66. The edge portions 26A-26F may be bent utilizing known metal forming tools or the like (not shown) along bend lines to form corners 62A-62F. It will be understood that virtually any suitable forming/bending process and/or tooling may be utilized. Portions 64 of the polymer material 30 of the first shot may extend around the corners 62A-62F. Although the portions 64 at corners 62A-62F may fracture due to the bending, the polymer material 30 forming portions 64 is later encapsulated by the polymer material 42 of the second molding shot, such that fracture is not detrimental to the integrity of the device 1. It will be understood that fracturing may or may not occur.

Figure 8:
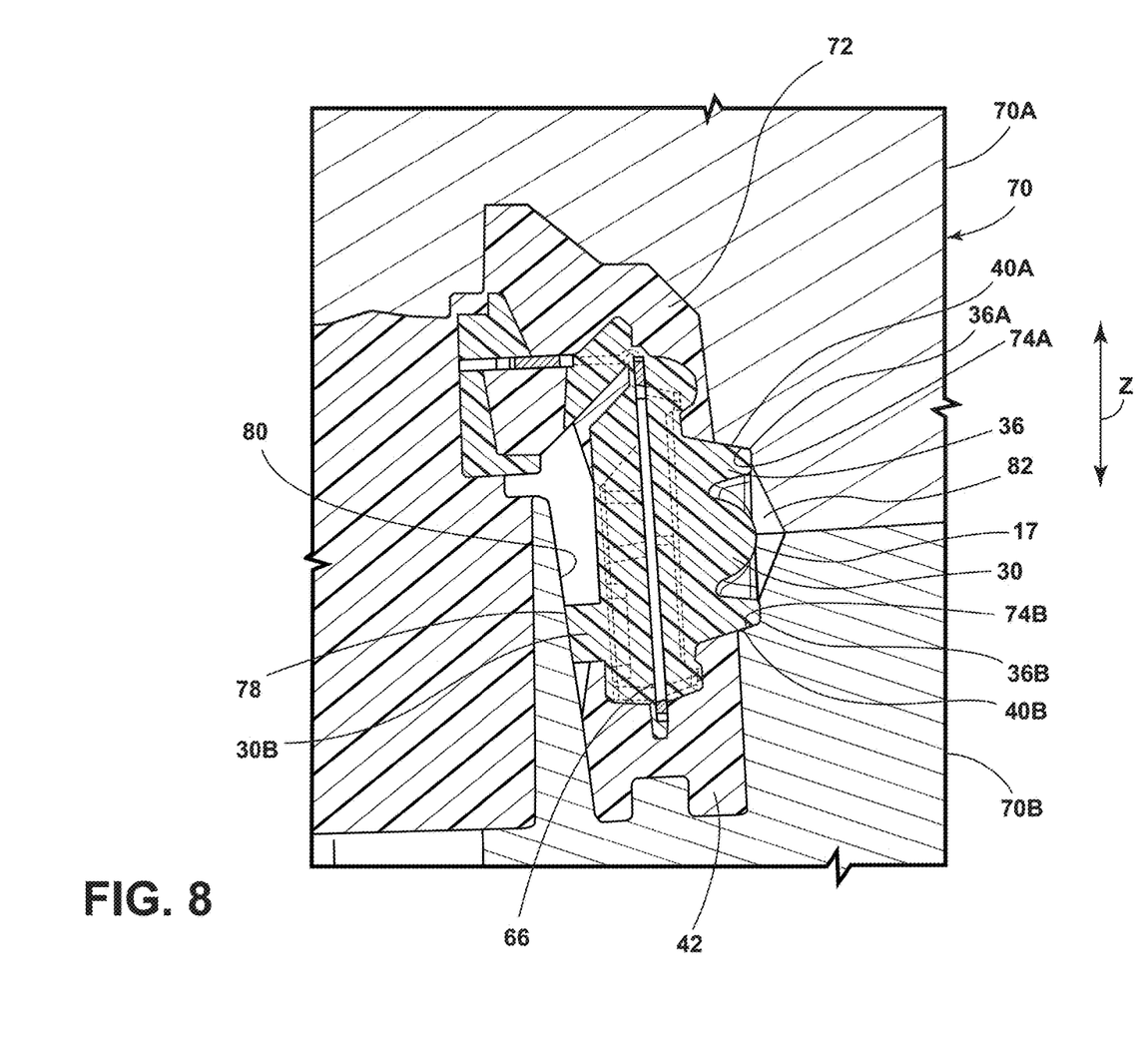
FIG. 8 is a partially fragmentary cross-sectional view of a mold tool utilized to provide a second mold shot.

With further reference to FIG. 8, the intermediate assembly 66 (FIG. 7) is then positioned in a mold cavity 72 formed by upper and lower mold parts 70A and 70B, respectively, of a second mold tool 70. Upper mold tool 70A includes a sealing surface 74A that engages upper perimeter surface portion 40A of wall or flange 36 formed by the polymer material 30 of the first molding shot, and the second mold tool 70B includes a second sealing surface 74B that engages the lower perimeter surface 40B. The mold tool parts 70A and 70B may be operably interconnected for linear vertical motion relative to one another in the Z direction. The first and second mold tools 70A and 70B are initially spaced apart from one another, and the intermediate assembly 66 may be positioned between the mold parts 70A and 70B with a surface 78 of first shot polymer mold material 30B in contact with a locating surface 80 of tool part 70B. Contact between wall or flange 36B and perimeter surface 40B further locates and positions the intermediate assembly 66 relative to the lower tool part 70B.

The upper mold tool part 70A is then shifted linearly in the Z direction (e.g. downwardly) to the closed position of FIG. 8, and the polymer material 42 of the second shot is then injected into the cavity 72 to thereby at least partially encapsulate the polymer material 30 of the first mold shot. The upper and lower mold tool parts 70A and 70B form a cavity 82 adjacent the convex portion 17 of lens 4 to thereby ensure that the convex portion 17 and outer surface thereof are not damaged in the second mold tool 70. Because the sealing surfaces 74 and 76 of the mold tool parts 70A and 70B, respectively, seal against the outwardly facing perimeter surface 40 around convex lens portion 17, the polymer material 42 does not flow into the cavity 82. This produces a final device 1 (FIG. 1) having lenses 4 that may be made of a clear or tinted light-transmitting polymer material that is not covered by the polymer material 42 of the second molding shot. The polymer material 42 of the second molding shot may be opaque (e.g. black or other suitable color), such that the electrical circuit elements 28 and other internal components are not visible from the outside in the finished device 1.

As discussed above, as shown in FIG. 1, the wall 36 of the lenses 4 includes end portions 36C and 36D. As shown in FIG. 1, the upper end wall portions 36C face outwardly and somewhat upwardly. The lower wall portions 36D face outwardly and downwardly. Corresponding portions of the sealing surfaces 74A and 74B (FIG. 8) of the mold tool parts 70A and 70B seal against the perimeter surface 40 at the wall portions 36C and 36D as the mold parts 70A and 70B are brought to the closed position of FIG. 8. Tool 70 is thereby configured to seal off the convex portion 17 of the lenses 4 around the entire perimeter surface 40 of wall 36 utilizing only linear Z-axis relative motion of tool parts 70A and 70B. It will be understood, however, that the present disclosure is not limited to arrangements that utilize only single-axis linear movements, and other tooling configurations may be utilized as required for a particular application. This ensures that the polymer material 42 utilized in the second shot mold step is not able to enter the cavity 82.

The illuminated device 1 is configured to permit fabrication having a second molding shot utilizing first and second mold tool parts 70A and 70B that translate linearly along the Z axis relative to one another and seal around the entire perimeter surface 40 of wall 36 around the convex lens portion 17. This may provide significant advantages relative to other arrangements. However, it will be understood that the present disclosure is not necessarily limited to any specific tooling or process. For example, if required for a particular application, mold tooling having additional components that do not move parallel to the Z axis may be utilized. Furthermore, additional molding and/or forming steps or processes may be utilized in addition to the first and second molding steps or shots described above.

The molding process described herein may comprise introducing molten thermoplastic polymer material and/or thermosetting polymer material and/or other suitable materials into one or more mold cavities. Furthermore, although the use of at least first and second mold cavities is preferred, additional mold cavities and processes may be utilized. Furthermore, other forming processes (e.g. thermoforming) may be utilized. Thus, the process of fabricating device 1 may include virtually any number of molding or forming steps, and virtually any combination of materials may be utilized.

The invention claimed is:

1. A method of fabricating an illuminated optical device, the method comprising:

forming an electrically conductive circuit having first and second opposite side surfaces and first and second regions;

securing at least one LED to the second region;

forming a lens having an exterior light-emitting surface by at least partially encapsulating the LED with a light-transmitting first polymer material, wherein the light-transmitting first polymer material forms a perimeter surface around the exterior light-emitting surface of the lens, the perimeter surface facing outwardly away from the exterior light-emitting surface of the lens;

followed by forming an intermediate assembly by bending the electrically conductive circuit between the first and second regions such that first side surfaces of the first and second regions are transverse relative to one another;

positioning the intermediate assembly in a mold tool, wherein the mold tool includes first and second tool components that move relative to each other between open and closed positions, and wherein the first and second tool components define a mold cavity around at least a portion of the intermediate assembly when in the closed position, and wherein the first and second tool components have first and second sealing surfaces, respectively, that engage the perimeter surface around the exterior light-emitting surface of the lens and close off the cavity whereby the exterior light-emitting surface of the lens is outside of the cavity;

at least partially filling the mold cavity with a second polymer material; and curing the second polymer material.

2. The method of claim 1, wherein:
the conductive circuit is formed from sheet metal of uniform thickness.

3. The method of claim 2, wherein:
the conductive circuit is flat prior to bending; and
the first and second portions are orthogonal to one another after bending.

4. The method of claim 1, wherein:
the light-transmitting first polymer comprises a material selected from the group consisting of thermoplastic polymers and thermosetting polymers.

5. The method of claim 1, wherein:
the second polymer comprises an opaque polymer material selected from the group consisting of thermoplastic polymers and thermosetting polymers.

6. The method of claim 1, wherein:
the light-transmitting first polymer includes at least one convex region forming a lens that distributes light emitted from the LED in a predefined pattern.

7. The method of claim 6, wherein:
the light-transmitting first polymer includes a wall extending around the at least one convex region, wherein the wall forms the perimeter surface.

8. The method of claim 7, wherein:
the light-transmitting first polymer forms a groove extending around the at least one convex region.

9. The method of claim 8, wherein:
the light-transmitting first polymer includes a base portion that is molded to the electrically conductive circuit, and wherein the at least one convex region and the wall are integrally formed with the base portion.

10. The method of claim 9, wherein:
the at least one convex region and the wall extend outwardly from the base portion.

11. The method of claim 10, wherein:
the wall includes horizontally-extending upper and lower sections defining upwardly and downwardly facing perimeter surface portions, respectively, and end portions extending between and interconnecting the horizontally-extending upper and lower sections, and wherein each end section is non-linear and defines upper perimeter portions facing outwardly and upwardly, and lower perimeter portions facing outwardly and downwardly.

12. A method of fabricating an illuminated optical device, the method comprising:
forming an electrically conductive circuit;
securing at least one LED to the electrically conductive circuit;
at least partially encapsulating the LED with a light-transmitting first polymer material to form a lens having a light-emitting surface that faces away from the electrically conductive circuit;
forming a perimeter surface around the exterior light-emitting surface of the lens;
bending the electrically conductive circuit to form first and second regions having side surfaces that are transverse relative to one another;
bringing a mold tool into contact with the perimeter surface to form a barrier preventing flow of polymer material over the lens; and
molding a second polymer material over at least a portion of the first polymer material while the mold tool is in contact with the perimeter surface, whereby the mold tool prevents the second polymer material from being molded over the exterior light-emitting surface of the first polymer material.

13. The method of claim 12, wherein:
the perimeter surface faces outwardly away from the exterior light-emitting surface of the lens.

14. The method of claim 12, wherein:
the conductive circuit is generally flat prior to bending;
the first and second regions are generally orthogonal to one another after bending.

15. The method of claim 12, wherein:
the light-transmitting first polymer includes at least one convex region forming a lens that distributes light emitted from the LED in a predefined pattern.

16. A method of fabricating an illuminated optical device, the method comprising:
forming an electrically conductive circuit;
securing at least one LED to the electrically conductive circuit;
at least partially encapsulating the LED with a light-transmitting first polymer material to form a lens having a light-emitting surface that faces away from the electrically conductive circuit;
forming a perimeter surface around the exterior light-emitting surface of the lens;
bending the electrically conductive circuit to form an intermediate assembly including first and second regions having side surfaces that are transverse relative to one another;
molding a second polymer material over at least a portion of the first polymer material without molding over the exterior light-emitting surface of the first polymer material with the second polymer material;
positioning the intermediate assembly in a mold tool, wherein the mold tool includes first and second tool components that move relative to each other between open and closed positions, and wherein the first and second tool components define a mold cavity around at least a portion of the intermediate assembly when in the closed position, and wherein first and second tool components have first and second sealing surfaces, respectively, that engage the perimeter surface around the exterior light-emitting surface of the lens and close off the cavity whereby the exterior light-emitting surface of the lens is outside of the cavity.

17. An illuminated optical device comprising:
an electrically conductive circuit having horizontal and vertical portions;
at least one LED light source disposed on the vertical portion;
a lens comprising light-transmitting first polymer material injection molded onto the vertical portion of the electrically conductive circuit, the light-transmitting first polymer material at least partially encapsulating the LED light source and defining a light-transmitting exterior surface; and
a body comprising an opaque second polymer material encapsulating at least a portion of the electrically conductive circuit and extending around the light-transmitting exterior surface of the lens without covering the light-transmitting exterior surface.

18. The illuminated optical device of claim 17, wherein:
the first and second polymer materials comprise thermoplastic polymers.

19. The illuminated optical device of claim 17, wherein:
the light-transmitting exterior surface includes at least one convex portion and a channel extending around the at least one convex portion.

20. An illuminated optical device comprising:
an electrically conductive circuit having horizontal and vertical portions;
at least one LED light source disposed on the vertical portion;
a lens comprising light-transmitting first polymer material at least partially encapsulating the LED light source and defining a light-transmitting exterior surface;
a body comprising a second polymer material encapsulating at least a portion of the electrically conductive circuit and extending around the light-transmitting exterior surface of the lens without covering the light-transmitting exterior surface, the body including a central portion defining a vertical axis;
wherein the electrically conductive circuit includes a plurality of vertical portions disposed about the vertical axis and facing away from the vertical axis at non-equal angular orientations;
and wherein LED light sources are disposed on at least two of the vertical portions; and including:
lenses comprising light-transmitting first polymer material encapsulating the LED light sources whereby the lenses are configured to distribute light outwardly away from the vertical axis.

* * * * *